United States Patent
Park et al.

(10) Patent No.: US 12,354,399 B2
(45) Date of Patent: Jul. 8, 2025

(54) DISPLAY DEVICE

(71) Applicant: SAMSUNG DISPLAY CO., LTD., Yongin-si (KR)

(72) Inventors: Yonghan Park, Hwaseong-si (KR); Sangmin Kim, Suwon-si (KR); Seungho Baek, Cheonan-si (KR); Youngseok Seo, Seoul (KR); Seunghoon Lee, Hwaseong-si (KR)

(73) Assignee: SAMSUNE BISASSIGNS, LTD., Yongin-si (KR)

( * ) Notice: Subject to any disclaimer, the term of this patent is extended or adjusted under 35 U.S.C. 154(b) by 0 days.

(21) Appl. No.: 18/379,255

(22) Filed: Oct. 12, 2023

(65) Prior Publication Data
US 2024/0037982 A1  Feb. 1, 2024

Related U.S. Application Data

(62) Division of application No. 17/378,926, filed on Jul. 19, 2021, now abandoned, which is a division of
(Continued)

(30) Foreign Application Priority Data

Mar. 5, 2018 (KR) ........................ 10-2018-0025545

(51) Int. Cl.
*G06V 40/13* (2022.01)
*H10K 50/87* (2023.01)
(Continued)

(52) U.S. Cl.
CPC ...... *G06V 40/1318* (2022.01); *G06V 40/1329* (2022.01); *H10K 50/87* (2023.02);
(Continued)

(58) Field of Classification Search
CPC .... G06K 9/0002; G06K 7/14; G06K 9/00013; G06K 9/0004; G06F 2203/0338; G06F 2203/04111
See application file for complete search history.

(56) References Cited

U.S. PATENT DOCUMENTS 10,452,937 B2   10/2019  Jin et al.
10,456,052 B2   10/2019  Lee
(Continued)

FOREIGN PATENT DOCUMENTS

KR   10-1407936       6/2014
KR   10-2017-0020148  2/2017
(Continued)

OTHER PUBLICATIONS

Korean Office Action dated May 23, 2022 issued in corresponding Korean Patent Application No. 10-2018-0025545.

*Primary Examiner* — Yuzhen Shen
(74) *Attorney, Agent, or Firm* — F. CHAU & ASSOCIATES, LLC

(57) ABSTRACT

A display device includes an optical fingerprint sensor; a display panel; a patterned film disposed below the display panel and having an opening portion that exposes the optical fingerprint sensor; a heat dissipating layer disposed below the patterned film, and that dissipates heat; and a cushion layer disposed between the patterned film and the heat dissipating layer, and that absorbs an impact. The optical fingerprint sensor is disposed below the cushion layer, and the heat dissipating layer has an opening portion that has a size larger than a size of the opening portion of the patterned film.

8 Claims, 12 Drawing Sheets

Related U.S. Application Data application No. 16/292,793, filed on Mar. 5, 2019, now Pat. No. 11,087,110.

(51) Int. Cl.
  *H10K 59/60* (2023.01)
  *H10K 59/65* (2023.01)
  *H10K 59/80* (2023.01)
  *G06F 3/041* (2006.01)

(52) U.S. Cl.
  CPC ............. *H10K 59/60* (2023.02); *H10K 59/65* (2023.02); *H10K 59/8794* (2023.02); *G06F 3/0412* (2013.01)

(56) References Cited

U.S. PATENT DOCUMENTS

| | | | |
|---|---|---|---|
| 10,824,840 | B2 | 11/2020 | Song et al. |
| 11,087,110 | B2 | 8/2021 | Park et al. |
| 2014/0356584 | A1 | 12/2014 | Yang et al. |
| 2016/0055793 | A1* | 2/2016 | Jang ................... B32B 5/18 428/408 |
| 2016/0232397 | A1 | 8/2016 | Yu et al. |
| 2017/0045918 | A1* | 2/2017 | Han ................... G06F 1/1684 |
| 2017/0212613 | A1 | 7/2017 | Hwang et al. |
| 2018/0151641 | A1 | 3/2018 | Choo et al. |
| 2018/0365466 | A1 | 12/2018 | Shim et al. |
| 2018/0365472 | A1 | 12/2018 | Cai |
| 2019/0073505 | A1 | 3/2019 | Kwon et al. |
| 2019/0087630 | A1* | 3/2019 | Seo ................... G06F 1/1684 |
| 2019/0147214 | A1 | 5/2019 | Lee et al. |
| 2019/0196589 | A1 | 6/2019 | Shim et al. |
| 2019/0272407 | A1 | 9/2019 | Park et al. |
| 2020/0280015 | A1* | 9/2020 | Odaka ................... H05B 33/14 |
| 2020/0287161 | A1 | 9/2020 | Kim |
| 2021/0342567 | A1 | 11/2021 | Park et al. |

FOREIGN PATENT DOCUMENTS

| | | |
|---|---|---|
| KR | 10-2017-0087635 | 7/2017 |
| KR | 10-2017-0098450 | 8/2017 |
| KR | 10-2017-0103159 | 9/2017 |
| KR | 10-2017-0119623 | 10/2017 |
| KR | 10-2017-0141522 | 12/2017 |

* cited by examiner

DISPLAY DEVICE

CROSS-REFERENCE TO RELATED APPLICATIONS

This application is a Divisional of U.S. patent application Ser. No. 17/378,926 filed on Jul. 19, 2021, which is a Divisional of U.S. patent application Ser. No. 16/292,793 filed on Mar. 5, 2019, now U.S. Pat. No. 11,087,110, which claims priority under 35 U.S.C. § 119 to Korean Patent Application No. 10-2018-0025545, filed on Mar. 5, 2018, in the Korean Intellectual Property Office (KIPO), the disclosures of which are incorporated by reference herein in their entireties.

1. Technical Field

Exemplary embodiments of the present invention relate to a display device, and more particularly, to a display device having an optical fingerprint sensor and cushioning and heat dissipating layers.

2. Discussion of Related Art

A display device may be classified as a liquid crystal display ("LCD") device, an organic light emitting diode ("OLED") display device, a plasma display panel ("PDP") display device or an electrophoretic display device.

An optical fingerprint sensor may be installed on a display panel of an OLED display device to facilitate fingerprint recognition for authentication. When multiple layers are disposed between the display panel and the optical fingerprint sensor, the transmittance of light reaching the optical fingerprint sensor may be reduced.

SUMMARY

According to an exemplary embodiment of the present invention, a display device includes an optical fingerprint sensor; a display panel; a patterned film disposed below the display panel and having an opening portion that exposes the optical fingerprint sensor; a heat dissipating layer disposed below the patterned film, and that dissipates heat; and a cushion layer disposed between the patterned film and the heat dissipating layer, and that absorbs an impact. The optical fingerprint sensor is disposed below the cushion layer, and the heat dissipating layer has an opening portion that has a size larger than a size of the opening portion of the patterned film.

In an exemplary embodiment of the present invention, the display device further includes an embossing layer disposed between the patterned film and the cushion layer.

In an exemplary embodiment of the present invention, the cushion layer has an opening portion that has a size substantially the same as the size of the opening portion of the patterned film.

In an exemplary embodiment of the present invention, the embossing layer has an opening portion that has a size substantially the same as the size of the opening portion of the patterned film.

According to an exemplary embodiment of the present invention, a display device includes an optical fingerprint sensor; a display panel; a patterned film disposed below the display panel; a heat dissipating layer disposed below the patterned film, and that dissipates heat; and a cushion layer disposed between the patterned film and the heat dissipating layer, and that absorbs an impact. The heat dissipating layer includes an opening portion having a plurality of holes, and the optical fingerprint sensor is disposed below the heat dissipating layer.

In an exemplary embodiment of the present invention, the display device further includes an embossing layer disposed between the patterned film and the cushion layer, and including an opening portion.

In an exemplary embodiment of the present invention, the cushion layer has an opening portion that has a size substantially the same as a size of the opening portion of the embossing layer.

In an exemplary embodiment of the present invention, the opening portion of heat dissipating layer, the opening portion of the embossing layer, and the opening portion of the cushion layer overlap one another.

In an exemplary embodiment of the present invention, the opening portion of the heat dissipating layer is located above the optical fingerprint sensor.

In an exemplary embodiment of the present invention, each of the holes has either a circular shape, a quadrate shape, a rectangular shape, a triangular shape, or a rhombic shape.

According to an exemplary embodiment of the present invention, a display device includes an optical fingerprint sensor; a display panel; a patterned film disposed below the display panel; a heat dissipating layer disposed below the patterned film, and that dissipates heat; and a cushion layer disposed between the patterned film and the heat dissipating layer, and that absorbs an impact. The patterned film and the heat dissipating layer include identical opening portions each having a plurality of holes, and the optical fingerprint sensor is disposed below the heat dissipating layer.

In an exemplary embodiment of the present invention, each of the holes hole has either a circular shape, a quadrate shape, a rectangular shape, a triangular shape, or a rhombic shape.

In an exemplary embodiment of the present invention, the display device further includes an embossing layer disposed between the patterned film and the cushion layer.

In an exemplary embodiment of the present invention, the embossing layer includes an opening portion, and the cushion layer includes an opening portion that is substantially the same size as the opening portion of the embossing layer. The opening portion of the embossing layer and the opening portion of the cushion layer form an air gap.

In an exemplary embodiment of the present invention, the opening portion of the patterned film, the opening portion of the heat dissipating layer, and the air gap are located above the optical fingerprint sensor.

According to an exemplary embodiment of the present invention, a display device includes an optical fingerprint sensor; a display panel; a patterned film disposed below the display panel; a heat dissipating layer disposed below the patterned film and that dissipates heat; a cushion layer disposed between the patterned film and the heat dissipating layer, and that absorbs an impact; and an embossing layer disposed between the patterned film and the cushion layer. The patterned film has an opening portion, and the cushion layer has an opening portion that is substantially same size as the opening portion of the patterned film. The optical fingerprint sensor is disposed at the opening portions of the patterned film and the cushion layer, and the heat dissipating layer has an opening portion. The optical fingerprint sensor is disposed at the opening portion of the heat dissipating layer.

In an exemplary embodiment of the present invention, the embossing layer has an opening portion. The optical fingerprint sensor is disposed at the opening portion of the embossing layer.

In an exemplary embodiment of the present invention, a size of the opening portion of the heat dissipating layer is larger than a size of the opening portion of the embossing layer.

In an exemplary embodiment of the present invention, the display device further includes an adhesive layer disposed between the display panel and the optical fingerprint sensor.

In an exemplary embodiment of the present invention, a size of the opening portion of the heat dissipating layer is larger than a size of the opening portion of the cushion layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
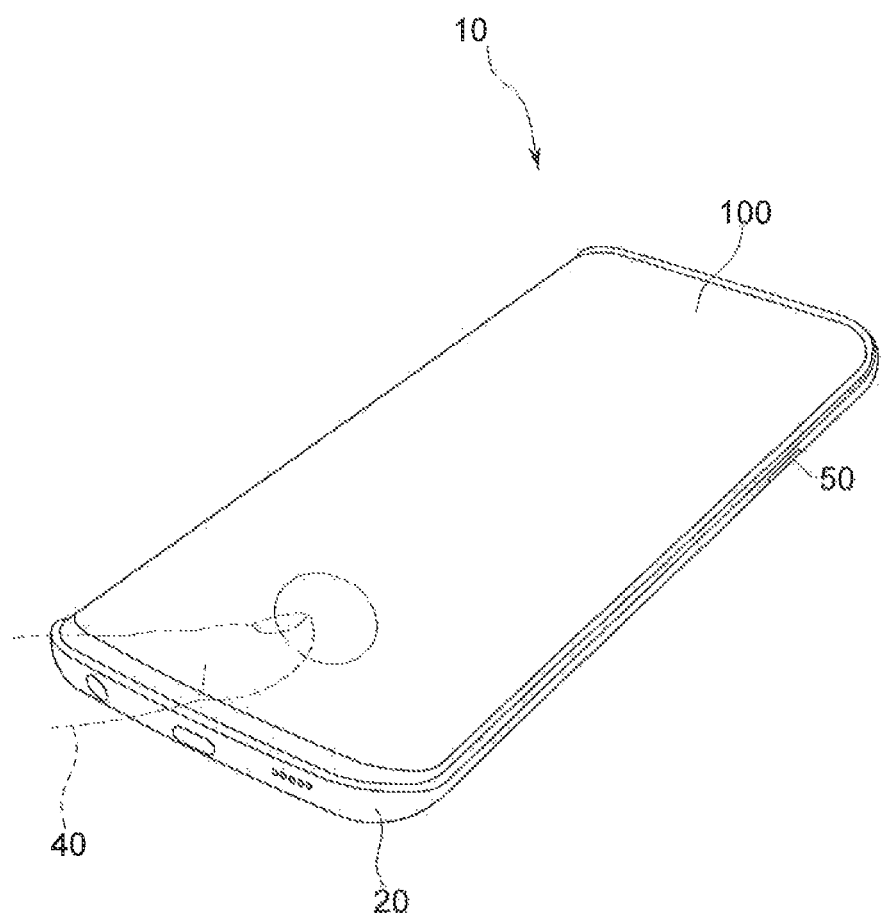
FIG. 1 is a perspective view illustrating a display device according to an exemplary embodiment of the present invention.

Exemplary embodiments of the present invention will now be described more fully hereinafter with reference to the accompanying drawings. It is to be understood that the present invention may, however, be embodied in different forms and thus should not be construed as being limited to the exemplary embodiments set forth herein.

In the drawings, sizes of elements in the drawings may be exaggerated for clarity. In other words, since sizes and thicknesses of elements in the drawings may be exaggerated for clarity, the following exemplary embodiments of the present invention are not limited thereto. It is to be understood that when a layer, area, or plate is referred to as being "on" another layer, area, or plate, it may be directly on the other layer, area, or plate, or intervening layers, areas, or plates may be present therebetween.

The spatially relative terms "below", "beneath", "lower", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawings is turned over, the elements described as "below" or "beneath" other elements would then be oriented "above" the other elements. Accordingly, the illustrative term "below" may encompass both an orientation of above and below. The device may be otherwise oriented (e.g., rotated 90 degrees or at other orientations) and the spatially relative descriptors used herein may be interpreted accordingly.

Throughout the specification, when an element is referred to as being "connected" to another element, the element may be "directly connected" and/or "electrically connected" to the other element, or intervening elements may be interposed therebetween.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element" without departing from the spirit and scope of the present invention.

In the drawings, like reference numerals may refer to like elements, and thus repetitive descriptions may be omitted.

Figure 2:
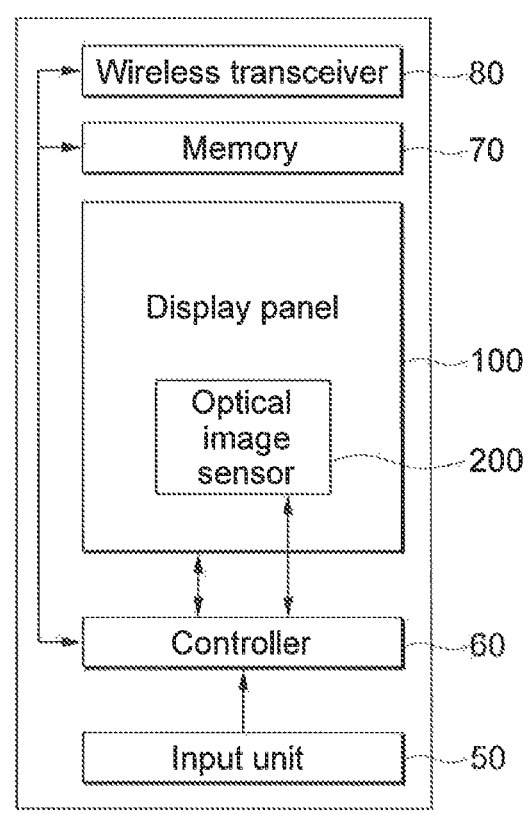
FIG. 2 is a block diagram illustrating a display device according to an exemplary embodiment of the present invention.

FIGS. 1 and 2 are respectively a perspective view and a block diagram illustrating a display device according to an exemplary embodiment of the present invention.

Referring to FIGS. 1 and 2, a display device 10 includes a housing 20 such as a portable housing, and a controller 60, an input unit 50, and an optical image sensor 200 secured in the housing 20. The display device 10 may be a mobile wireless communication device, for example, a cellular telephone, a media player, or a personal digital assistant (PDA). The display device 10 may be another type of electronic devices, for example, a tablet computer, a laptop computer, a wearable computer, or the like.

A wireless transceiver 80 is also secured in the housing 20 and is coupled to the controller 60. The wireless transceiver 80 performs at least one wireless communication function on, for example, voice and/or data, in cooperation with the controller 60. In an exemplary embodiment of the present invention, the display device 10 may not include the wireless transceiver 80 or other wireless communication circuitry. The controller 60 may include an application processor (AP) and a driving chip for controlling a display panel and a touch layer.

A display panel 100 (which may, for example, be also referred to as a display layer or a display area) is secured in the housing 20 and is coupled to the controller 60. The display panel 100 may be a flexible display panel. As used herein, the term "flexible" means a characteristic capable of being bent, and may be understood as including structures from ones that can be completely folded to ones that can be bent at the nanometer level. However, embodiments are not limited thereto. The display panel 100 may be, for example, a light emitting diode (LED) display panel. In addition, the display panel 100 may include additional circuitry to provide a touch display function.

A memory 70 is coupled to the controller 60. The memory 70 stores, for example, finger matching biometric template data. The memory 70 may store other or additional types of data.

As can be understood by those skilled in the art, the display panel 100 may be a touch display, and the touch display may serve as both an input device and a display for displaying an image. In addition, the display panel 100 may perform one or more functions in response to the input in cooperation with the controller 60. For example, the display panel 100 may perform the turning on and off of the power of the display device 10, the initiation of communication through the wireless transceiver 80, and/or a menu function based on input to a touch display. For example, an input may be a touch input from a user's finger or a stylus pen.

For example, regarding the menu function, the controller 60 may communicate with the display panel 100 to display a menu of available applications on the display panel 100 based on an input or press on the display panel 100. In addition, the input unit 50, such as a push button switch, may be secured in the housing 20.

Figure 3:
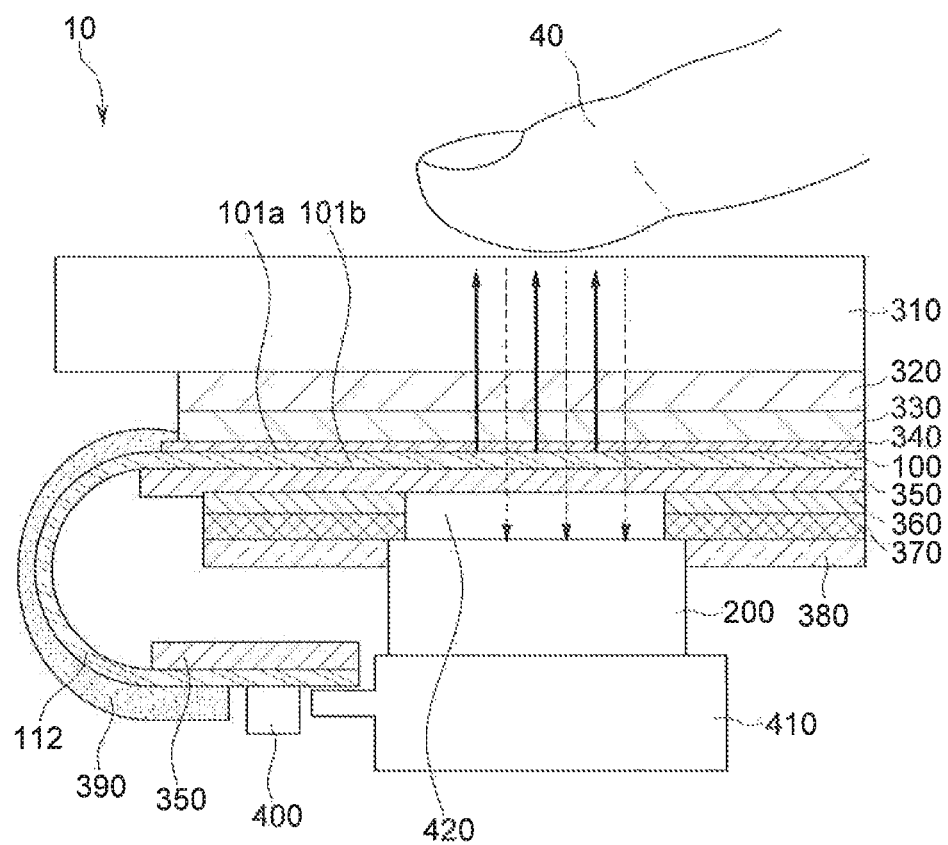
FIG. 3 is a cross-sectional view illustrating the display device of FIG. 1.

FIG. 3 is a cross-sectional view illustrating the display device of FIG. 1.

Referring to FIG. 3, the display device 10 includes a transparent cover layer 310, an optically clear adhesive ("OCA") film 320, a polarizing layer 330, a display panel 100, a patterned film 350, an embossing layer 360, a cushion layer 370, a heat dissipating layer 380, a backplane 390, an optical fingerprint sensor 200, a flexible printed circuit board 410, and a driving chip 400.

The transparent cover layer 310 may form the front appearance of the display device and may provide a finger placement surface configured to accommodate an adjacent finger 40 and to receive a touch input. For example, the transparent cover layer 310 may be a window for a user to view a displayed image. According to an exemplary embodiment of the present invention, the transparent cover layer 310 may include a transparent material, e.g., glass, so that contents or images output from the display panel 100 is exposed to the outside. According to an exemplary embodiment of the present invention, a part of the perimeter of the transparent cover layer 310 may be curved in the direction toward a lower surface of the display device 10 to form a curved surface. For example, the transparent cover layer 310 may be curved around side surfaces of the display device 10.

The display panel 100 includes a first surface 101a and a second surface 101b opposite to the first surface 101a. The display panel 100 may include polyimides ("PI").

The polarizing layer 330 is disposed on the display panel 100. For example, the polarizing layer 330 may be disposed above the display panel 100, and the polarizing layer 330 may be disposed on the first surface 101a of the display panel 100.

An adhesive layer 340 is disposed between the display panel 100 and the polarizing layer 330.

The OCA film 320 is disposed on the transparent cover layer 310. For example, the OCA film 320 may be disposed beneath the transparent cover layer 310, and the polarizing layer 330 may be disposed between the adhesive layer 340 and the OCA film 320. The adhesive layer 340 couples the polarizing layer 330 and the display panel 100 together.

A functional layer is disposed below the display panel 100, For example, the functional layer may include at least one of the patterned film 350, the embossing layer 360, the cushion layer 370 or the heat dissipating layer 380. The patterned film 350 may substantially prevent components or the like from being seen from the above, and may protect the display panel 100.

For example, the patterned film 350 may be disposed on the second surface 101b of the display panel 100.

The display panel 100 includes a bending portion 112, which is bent in one direction, and a portion extending in one direction from the bending portion 112 (e.g., a first portion of the bending portion 112). For example, the first portion may extend from the bending portion 112 and may overlap the second surface 101b of the display panel 100.

A part of the patterned film 350 is disposed below the display panel 100, and another part of the patterned film 350 is disposed on the first portion of the display panel 100 that extends in one direction from the bending portion 112. For example, the other part of the patterned film 350 may be disposed above the first portion of the display panel 100. A part of the patterned film 350 may be absent at the bending portion 112 of the display panel 100. In other words, the patterned film 350 is not disposed at the bending portion 112 of the display panel 100.

The embossing layer 360 is disposed on the patterned film 350, and the cushion layer 370 is disposed on the embossing layer 360. For example, the embossing layer 360 may be disposed below the patterned film 350, and the cushion layer 370 may be disposed below the embossing layer 360.

The cushion layer 370 may be in the form of a foam or a gel. In addition, the cushion layer 370 may include a material having elasticity, for example, rubber.

The heat dissipating layer 380 is on below the cushion layer 370. For example, the heat dissipating layer 380 may be disposed below the cushion layer 370. The heat dissipating layer 380 may dissipate heat. For example, the heat dissipating layer 380 may include copper graphite or the like.

The embossing layer 360 and the cushion layer 370 have an opening portion for forming an air gap 420.

The optical fingerprint sensor 200 for recognizing the fingerprint of the user may be disposed below the cushion layer 370. For example, the optical fingerprint sensor 200 may overlap the air gap 420.

The size of the opening portion of the embossing layer 360 and the size of the opening portion of the cushion layer 370 may be substantially the same as each other. The height of the air gap 420 ranges from about 0 cm to about 0.14 cm. The optical fingerprint sensor 200 has a width larger than a width of the opening portion in the embossing layer 360 and a width of the opening portion in the cushion layer 370. The opening portion of the embossing layer 360 and the opening portion of the cushion layer 370 exposes the optical fingerprint sensor 200 and receives light emitted from the display panel 100 and reflected from the finger 40. For example, light emitted from the display panel 100 and light reflected from the finger 40 passes through the opening portion of the embossing layer 360 and the opening portion of the cushion layer 370.

The heat dissipating layer 380 has an opening portion for placing the optical fingerprint sensor 200 therein. For example, a part of an upper end portion of the optical fingerprint sensor 200 may be disposed in the opening portion of the heat dissipating layer 380. The heat dissipating layer 380 may have an opening portion that has a size larger than the size of the opening portion of the embossing layer 360 and the opening portion of the cushion layer 370. For example, the opening portion of the heat dissipating layer 380 may have a width larger than a width of the opening portion of the embossing layer 360 and a width of the opening portion of the cushion layer 370. For example, the size of the opening portions may be measured in terms of radius, width, length, or the like.

The cushion layer 370 may absorb and alleviate an impact on the display panel 100.

The optical fingerprint sensor 200 has a height substantially the same as or less than about 0.46 cm.

A flexible printed circuit board ("FPCB") 410 is disposed on the optical fingerprint sensor 200. For example, the FPCB 410 may be disposed below the optical fingerprint sensor 200. For example, the FPCB 410 may form a plurality of six or less layers.

The driving chip 400 is disposed on the portion of the display panel 100 that extends in one direction from the bending portion 112. For example, the driving chip 400 may be disposed below the portion of the display panel 100.

The FPCB 410 is electrically connected to the portion of the display panel 100 that extends in one direction from the bending portion 112.

The bending portion 112 of the display panel 100 has a radius of curvature substantially the same as or less than about 0.41 cm.

The bending portion 112 of the display panel 100 starts from one end of the patterned film 350 and ends at another end of the patterned film 350. A part of the patterned film 350 is absent at the bending portion 112 of the display panel 100. In other words, the patterned film 350 is not disposed at the bending portion 112 of the display panel 100.

The backplane 390 is disposed on one surface of the bending portion 112 of the display panel 100, maintains the curvature of the bending portion 112 of the display panel 100, and may substantially prevent the display panel 100 from being bent excessively and damaged.

The height from an upper end of the transparent cover layer 310 to a lower end of the display panel 100 is substantially the same as or less than about 1.937 cm.

As illustrated in FIG. 3, although the embossing layer 360 and the cushion layer 370 have opening portions to allow the light reflected from the user's finger 40 to pass through, the patterned film 350 does not have an opening portion, such that only a part of the light reflected from the finger 40 passes through the patterned film 350 and reaches the optical fingerprint sensor 200. Accordingly, there is a problem in that the fingerprint recognition rate of the optical fingerprint sensor 200 may be lowered.

In addition, there is a problem in that heat dissipation may be reduced due to the opening portion of the heat dissipating layer 380.

Figure 4:
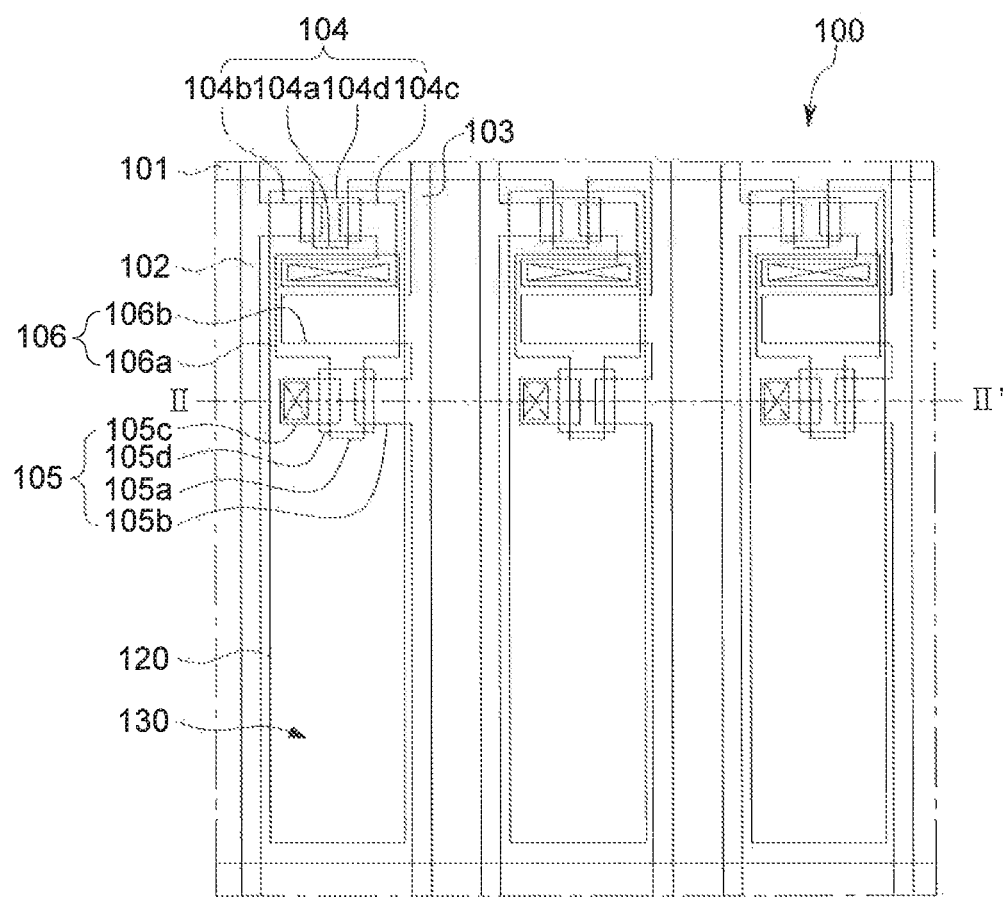
FIG. 4 is a plan view illustrating an OLED display panel of a display device according to an exemplary embodiment of the present invention.
Figure 5:
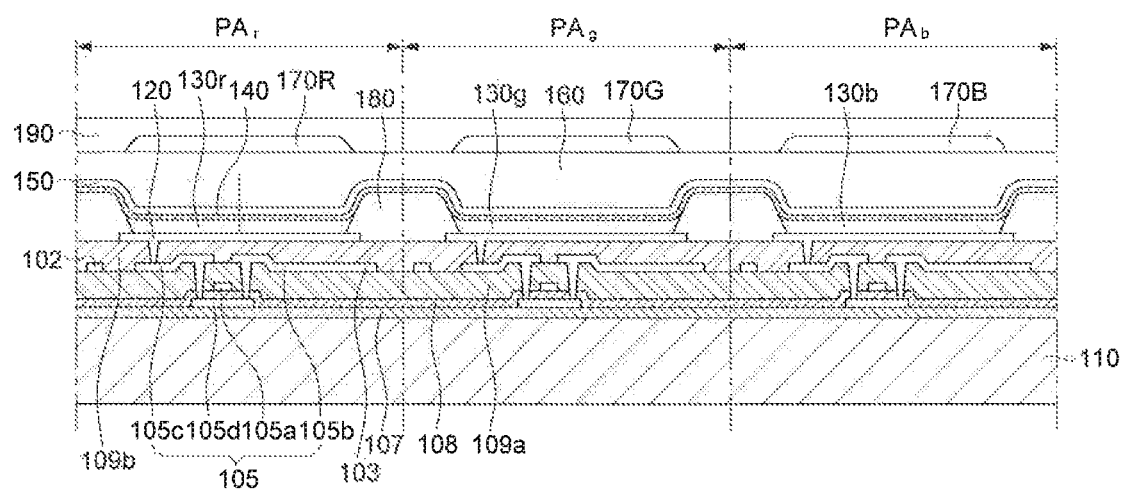
FIG. 5 is a cross-sectional view illustrating an OLED display panel of a display device according to an exemplary embodiment of the present invention.

FIGS. 4 and 5 are respectively a plan view and a cross-sectional view illustrating an OLED display panel of a display device according to an exemplary embodiment of the present invention.

Referring to FIGS. 4 and 5, the display panel 100 according to an exemplary embodiment of the present invention includes a gate line 101 disposed along one direction, a data line 102 insulated from and intersecting the gate line 101, a common power line 103, a switching thin film transistor ("TFT") 104, a driving TFT 105, and a capacitor 106.

For example, one pixel of the display device according to an exemplary embodiment of the present invention has a 2TFT-1CAP structure which includes two TFTs and one capacitor 106. However, exemplary embodiments of the present invention are not limited thereto, and one pixel may include three or more TFTs and/or two or more capacitors.

The switching TFT 104 selects a pixel from which light is to be emitted. The switching TFT 104 includes a switching gate electrode 104a connected to the gate line 101, a switching source electrode 104b connected to the data line 102, a switching drain electrode 104c connected to a first capacitor plate 106a, and a switching semiconductor layer 104d.

The driving TFT 105 applies a driving power, which allows an organic light emitting layer 130 in a pixel selected by the switching TFT 104 to emit light. The driving TFT 105 includes a driving gate electrode 105a connected to the first capacitor plate 106a, a driving source electrode 105b connected to the common power line 103, a driving drain electrode 105c connected to a first electrode 120, and a driving semiconductor layer 105d.

The capacitor 106 includes the first capacitor plate 106a and a second capacitor plate 106b. The first capacitor plate 106a is connected to the switching drain electrode 104c and the driving gate electrode 105a. The second capacitor plate 106) is connected to the common power line 103. The capacitance of the capacitor 106 is determined by the charge stored in the capacitor 106 and the voltage between the first capacitor plate 106a and the second capacitor plate 106b.

A voltage equivalent to a difference between a common voltage applied to the driving TFT 105 from the common power line 103 and the data voltage transmitted by (or from) the switching TFT 104 is stored in the capacitor 106. A current corresponding to the voltage stored in the capacitor 106 flows to the organic light emitting layer 130 through the driving TFT 105 such that the organic light emitting layer 130 may emit light.

The first substrate 110 may be formed using, for example, an insulating substrate including, for example, glass, quartz, ceramic and/or plastic. However, exemplary embodiments of the present invention are not limited thereto, and the first substrate 110 may include a metallic material, such as stainless steel.

The first substrate 110 includes red, green, and blue pixel areas $PA_r$, $PA_g$, and $PA_b$. The red, green and blue pixel areas $PA_r$, $PA_g$ and $PA_b$ may be a pixel defining layer 180 to be described below, and the red, green and blue pixel areas $PA_r$, $PA_g$ and $PA_b$ may be sequentially disposed on the first substrate 110. In addition, the first substrate 110 may include a white pixel area.

A buffer layer 107 is disposed on the first substrate 110, and may prevent infiltration of moisture or impurities through the first substrate 110 and is configured to planarize the surface of the first substrate 110. The buffer layer 107 may include an inorganic insulating layer or an organic insulating layer, and may be deposited on the first substrate 110 in various deposition methods, such as a plasma enhanced chemical vapor deposition ("PECVD") method, an atmospheric pressure chemical vapor deposition ("APCVD") method, or a low pressure chemical vapor deposition ("LPCVD") method, by using, e.g., $SiO_2$, $SiN_x$, or the like. However, exemplary embodiments of the present invention are not limited thereto, and the buffer layer 107 may be removed as needed.

The driving semiconductor layer 105d is disposed on the buffer layer 107, and the driving semiconductor layer 105d includes a source area, a drain area, and a channel area between the source area and drain area.

A gate insulating layer 108 is disposed on the buffer layer 107 to cover the driving semiconductor layer 105d, and the gate insulating layer 108 substantially prevents infiltration of moisture or impurities through the first substrate 110. The gate insulating layer 108 includes an insulating material and may be formed in a single layer or multiple layers including silicon nitride (SiNx) or silicon oxide (SiOx). However, exemplary embodiments of the present invention are not limited thereto, and the gate insulating layer 108 may include various insulating materials.

The driving gate electrode 105a is disposed on the gate insulating layer 108, and an insulating interlayer 109a is disposed on the gate insulating layer 108 to cover the driving gate electrode 105a.

The driving source and drain electrodes 105b and 105c are disposed on the insulating interlayer 109a and are spaced apart from each other, and the driving source and drain electrodes 105b and 105c respectively contact the source area and the drain area of the driving semiconductor layer 105d through respective opening areas provided in the gate insulating layer 108 and the insulating interlayer 109a.

A protective layer 109b is disposed on the insulating interlayer 109a to cover the driving source and drain electrodes 105b and 105c. The protective layer 109b may protect the driving TFT 105, and may include an inorganic insulating layer or an organic insulating layer.

The first electrode 120, the organic light emitting layer 130, and the second electrode 140 are sequentially disposed on the protective layer 109b. The first electrode 120 may be an anode for injecting holes, and the second electrode 140 may be a cathode for injecting electrons. However, exemplary embodiments of the present invention are not limited thereto, and the first electrode 120 may be a cathode and the second electrode 140 may be an anode.

The organic light emitting layer 130 may include a low molecular organic material or a high molecular organic material. The organic light emitting layer 130 may include red, green and blue organic light emitting layers 130r, 130g and 130b, and the red, green and blue organic light emitting layers 130r, 130g and 130b may be disposed in the red, green and blue pixel areas $PA_r$, $PA_g$ and $PA_b$, respectively. In an exemplary embodiment of the present invention, there may be no color filter. In addition, the organic light emitting layer 130 may include a single-color organic light emitting layer.

The display panel 100 according to an exemplary embodiment of the present invention has a top emission type structure, and thus the first electrode 120 may be formed of a reflective layer, and the second electrode 140 may be formed of a transflective film.

The reflective layer and the transflective film may include one or more metal of titanium (Ti), magnesium (Mg), silver (Ag), gold (Au), calcium (Ca), lithium (Li), chromium (Cr), and aluminum (Al), or an alloy thereof. The reflective layer and the transflective film are distinguished from each other by their thicknesses. Typically, the transflective film has a thickness of about 250 nm or less. In addition, the reflective layer and the transflective film may each have a multi-layer structure including a metal layer, which includes a metal or an alloy of a metal, and a transparent conductive oxide (TCO) layer stacked on the metal layer.

The first electrode 120 may further include a transparent conductive layer, and the transparent conductive layer may include transparent conductive oxide ("TCO"), such as indium tin oxide (ITO), indium zinc oxide (WO), zinc oxide (ZnO), and/or indium oxide ($In_2O_3$).

The first electrode 120 may have a structure including a reflective layer. In addition, the first electrode 120 may have a double-layer structure including a reflective layer and a transparent conductive layer, or a triple-layer structure in which a transparent conductive layer, a reflective layer, and a transparent conductive layer are sequentially stacked. However, exemplary embodiments of the present invention are not limited thereto, and the first electrode 120 may have a structure including a transparent conductive layer.

The second electrode 140 may have a structure including a transparent conductive layer. When the second electrode 140 includes a transparent conductive layer, the second electrode 140 may be an anode for injecting holes, and the first electrode 120 may be formed using a reflective layer and become a cathode.

In an exemplary embodiment of the present invention, the pixel defining layer 180 which covers the edges of the first electrode 120 and which includes a opening exposing a center portion of the first electrode 120 and overlapping the first electrode 120. For example, the first electrode 120, the organic light emitting layer 130, and the second electrode 140 are sequentially stacked in the opening of the pixel defining layer 180. The organic light emitting layer 130 and the second electrode 140 may also be formed on the pixel defining layer 180 as well.

A capping layer 150 is disposed on the second electrode 140. The capping layer 150 may protect the first electrode 120, the organic light emitting layer 130, and the second electrode 140 and is configured to allow the light generated in the organic light emitting layer 130 to be emitted to the outside.

A thin film encapsulation layer 160 is disposed on the capping layer 150. The thin film encapsulation layer 160 seals the first electrode 120, the organic light emitting layer 130, the second electrode 140, and the capping layer 150 to protect them from the infiltration of moisture, oxygen, or the like.

The thin film encapsulation layer 160 may have a structure in which at least one organic layer and at least one inorganic layer are alternately stacked. However, exemplary embodiments of the present invention are not limited thereto, and the thin film encapsulation layer 160 may be formed in a single layer, such as an organic layer or an inorganic layer.

The red color filter 170R, the green color filter 170G and the blue color filter 17011 may be disposed in the red pixel area $PA_r$, the green pixel area $PA_g$, and the blue pixel area $PA_b$ on the thin film encapsulation layer 160, respectively.

In addition, as described above, a protective film may be disposed below the first substrate 110, and the transparent cover layer 310 may be disposed above the color filters 170R, 170G, and 170B. In an exemplary embodiment of the present invention, a planarizing, layer 190 may be disposed between the color filters 170R, 170G, and 170B and the transparent cover layer 310. The planarizing layer 190 serves to flatten the layer on which the color filter 170R, 170G and 170B is disposed by removing the height difference of the color filter 170R, 1706 and 170B. The planarizing layer 190 may include one or more materials of the followings: a polyacrylate resin, an epoxy resin, a phenolic resin, a polyimide resin, a polyimide resin, an unsaturated polyester resin, a polyphenylene ether resin, a polyphenylene sulfide resin, and/or benzocyclobutene ("BCB").

In an exemplary embodiment of the present invention, the transparent cover layer 310 may be disposed on the thin film encapsulating layer 160, and the color filters 170R, 170G, and 170B, and the planarizing, layer 190 may be disposed on the transparent cover layer 310.

Figure 6:
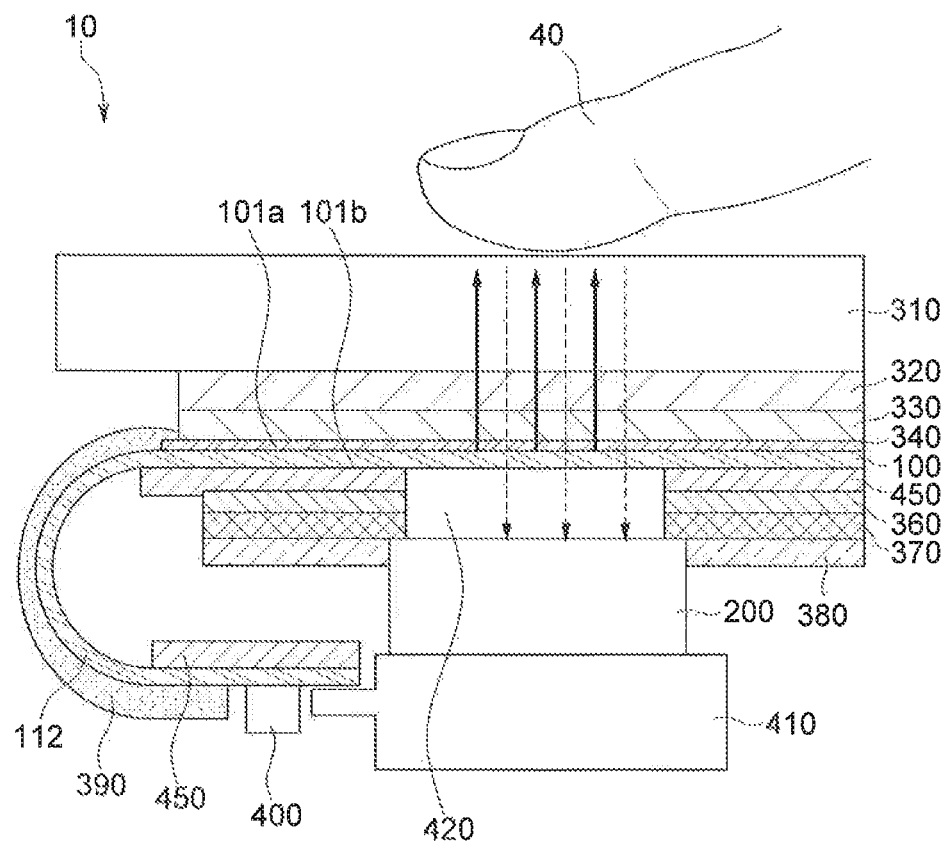
FIG. 6 is a cross-sectional view illustrating a display device according to an exemplary embodiment of the present invention.

FIG. 6 is a cross-sectional view illustrating a display device according to an exemplary embodiment of the present invention.

Figure 7:
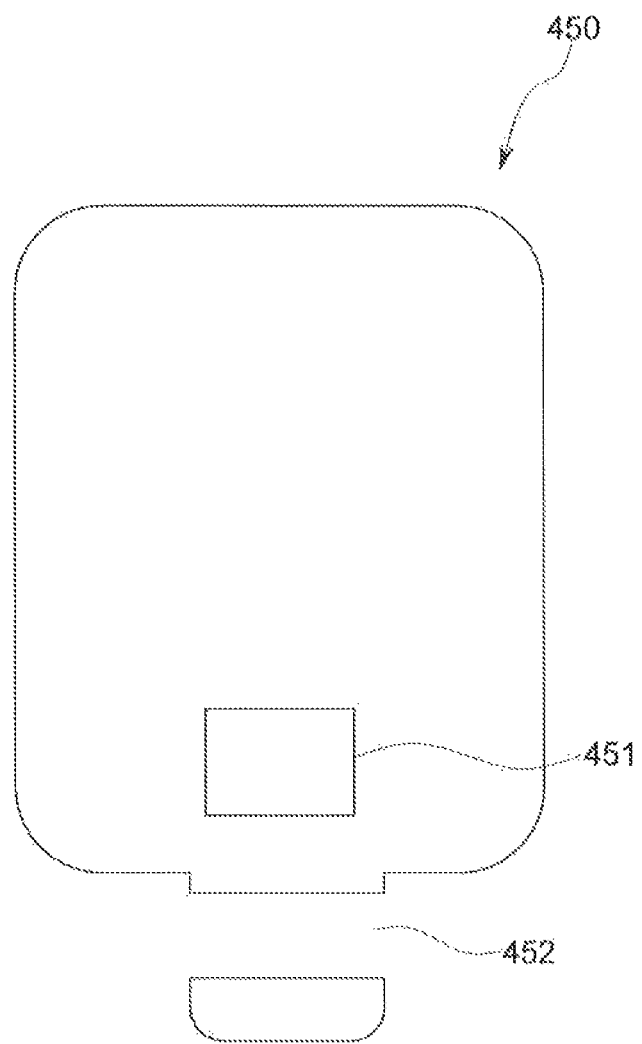
FIG. 7 is a plan view illustrating a patterned film of a display device according to an exemplary embodiment of the present invention.

FIG. 7 is a plan view illustrating a patterned film of a display device according to an exemplary embodiment of the present invention.

Elements in FIG. 6 are stacked in a structure substantially the same as a structure of FIG. 3, and a description of the same elements as those in FIG. 3 may be omitted to avoid redundancy.

Referring to FIGS. 6 and 7, a patterned film 450 of a display device 10 according to an exemplary embodiment of the present invention has an opening portion 451.

When an optical fingerprint sensor 200 has a rectangular shape, a quadrate shape, or a circular shape, the opening portion 451 of the patterned film 450 may have a size substantially the same as a size of an opening portion in an embossing layer 360 and as a size of an opening portion in a cushion layer 370. A gap 452 is provided in the patterned film 450 at a bending portion 112 of a display panel 100. For example, a part of the patterned film 450 may not be disposed at the bending portion 112 of a display panel 100.

For example, the opening portion 451 of the patterned film 450 may have a width substantially the same as or less than a width of the opening portion in the embossing layer 360 and the opening portion in the cushion layer 370. For example, the width and length of the opening portion 451 of the patterned film 450 may be substantially the same as or less than the width and length of the optical fingerprint sensor 200.

The opening portion 451 of the patterned film 450 may have a shape such as a quadrangle, a circle, or a rhombus, but the shape of the opening portion 451 is not limited thereto.

Since the opening portion 451 is in the patterned film 450, the rate of the light that is emitted from the display panel 100, reflected from a user's finger 40, and reaches the optical fingerprint sensor 200 may increase. Accordingly, the rate of fingerprint recognition may be increased.

Figure 8:
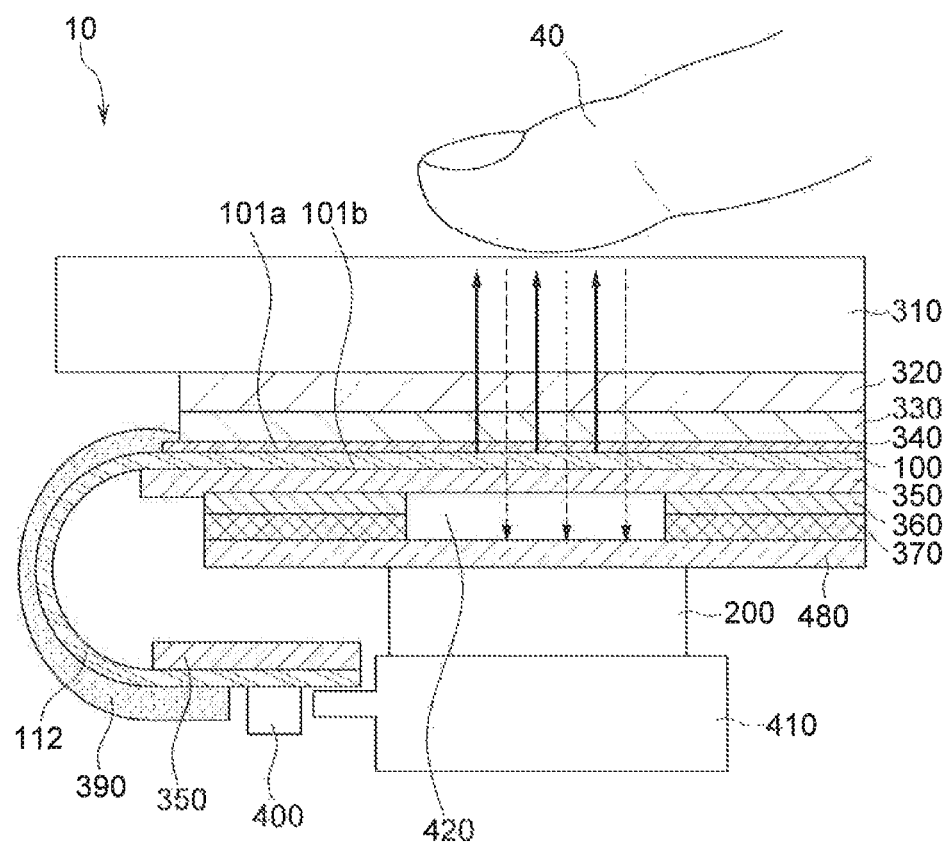
FIG. 8 is a cross-sectional view illustrating a display device according to an exemplary embodiment of the present invention.

FIG. 8 is a cross-sectional view illustrating a display device according to an exemplary embodiment of the present invention.

Figure 9:
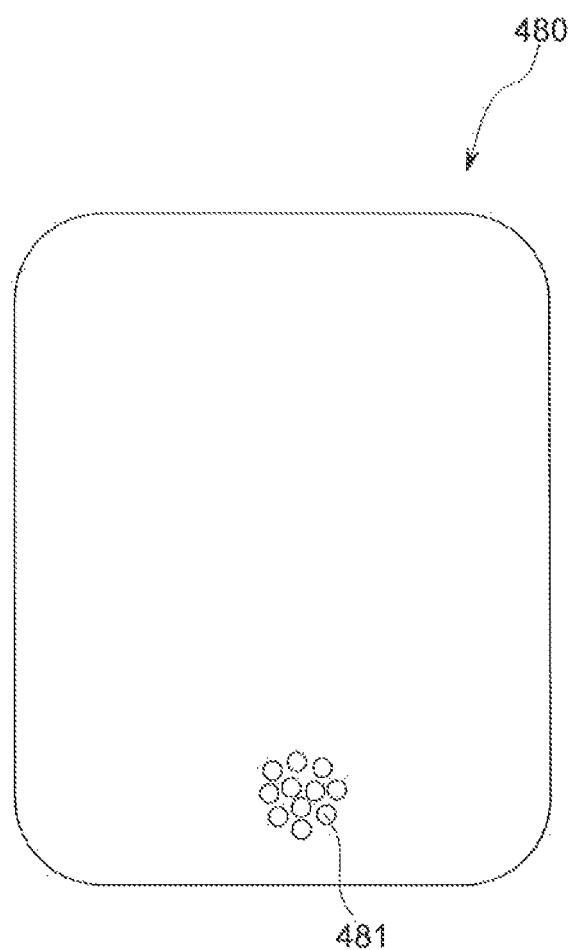
FIG. 9 is a plan view illustrating a heat dissipating layer of a display device according to an exemplary embodiment of the present invention.

FIG. 9 is a plan view illustrating a heat dissipating layer of a display device according to an exemplary embodiment of the present invention.

Elements in FIG. 8 are stacked in a structure substantially the same as a structure of FIG. 3, and a description of the same elements as those in FIG. 3 may be omitted to avoid redundancy.

Referring to FIGS. 8 and 9, an optical fingerprint sensor 200 is disposed on a heat dissipating layer 480. For example, the optical fingerprint sensor 200 may be disposed below the heat dissipating layer 480.

The heat dissipating layer 480 has an opening portion that includes a plurality of concentric circular holes 481. The plurality of concentric circular holes 481 may be arranged to form a circular shape. The plurality of holes 481 of the heat dissipating layer 480 are located above the optical fingerprint sensor 200 to allow the light emitted from the display panel 100 and reflected by a user's finger 40 to pass therethrough. The light that has passed through the plurality of holes 481 of the heat dissipating layer 480 reaches the optical fingerprint sensor 200. For example, the opening portion of the heat dissipating layer 480 may overlap the optical fingerprint sensor 200 and the opening portions of the embossing layer 360 and the cushion layer 370. The heat dissipating layer 480 having the plurality of holes 481 reduces the area of the opening portion in comparison to a case where the opening portion of the heat dissipating layer 480 is a single opening, thereby achieving the effect of increasing dissipation of the heat generated in the display panel 100, increasing the straightness of the light reflected by the user's finger 40, and reducing blurring of the fingerprint image recognized by the optical fingerprint sensor 200.

Although not shown in the drawings, each of the plurality of holes 481 of the heat dissipating layer may have a shape such as a circle, a square, a rectangle, a triangle, a rhombus, or a polygon, and may be arranged in a form of a mesh or a circle.

Figure 10:
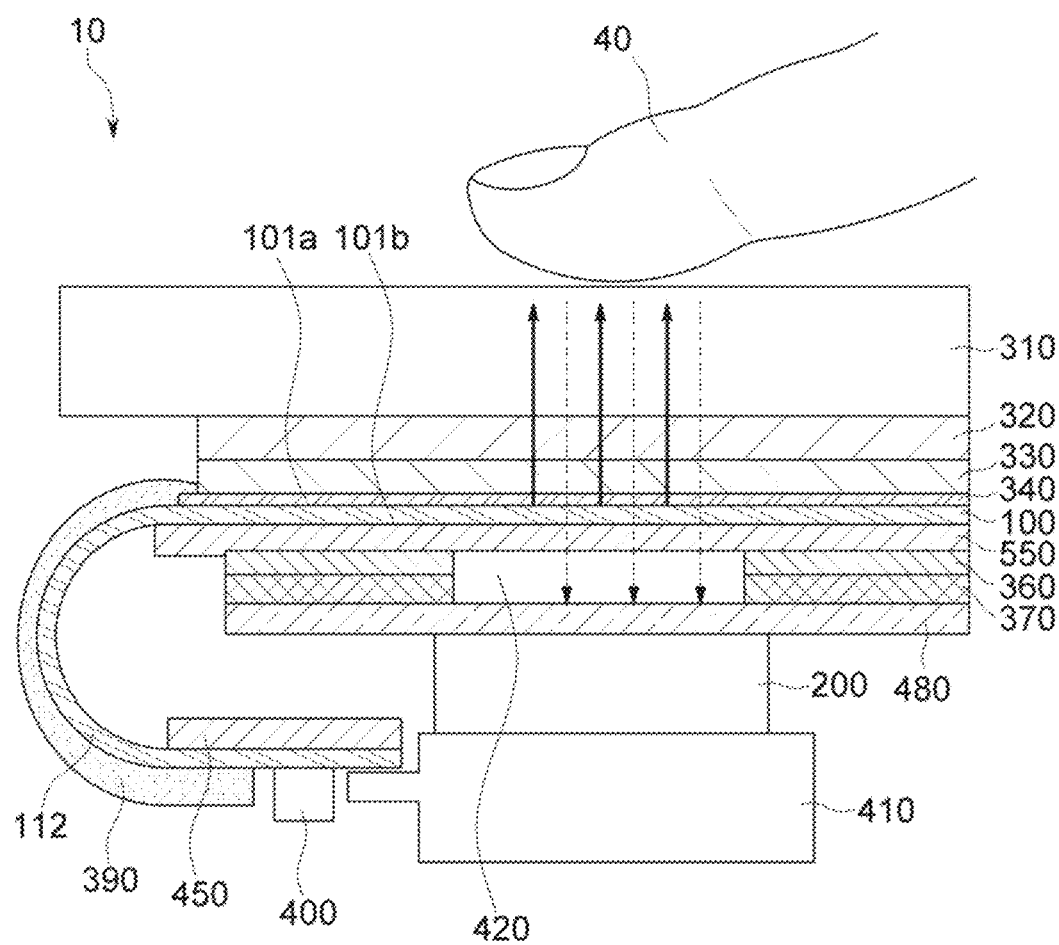
FIG. 10 is a cross-sectional view illustrating a display device according to an exemplary embodiment of the present invention.
Figure 11:
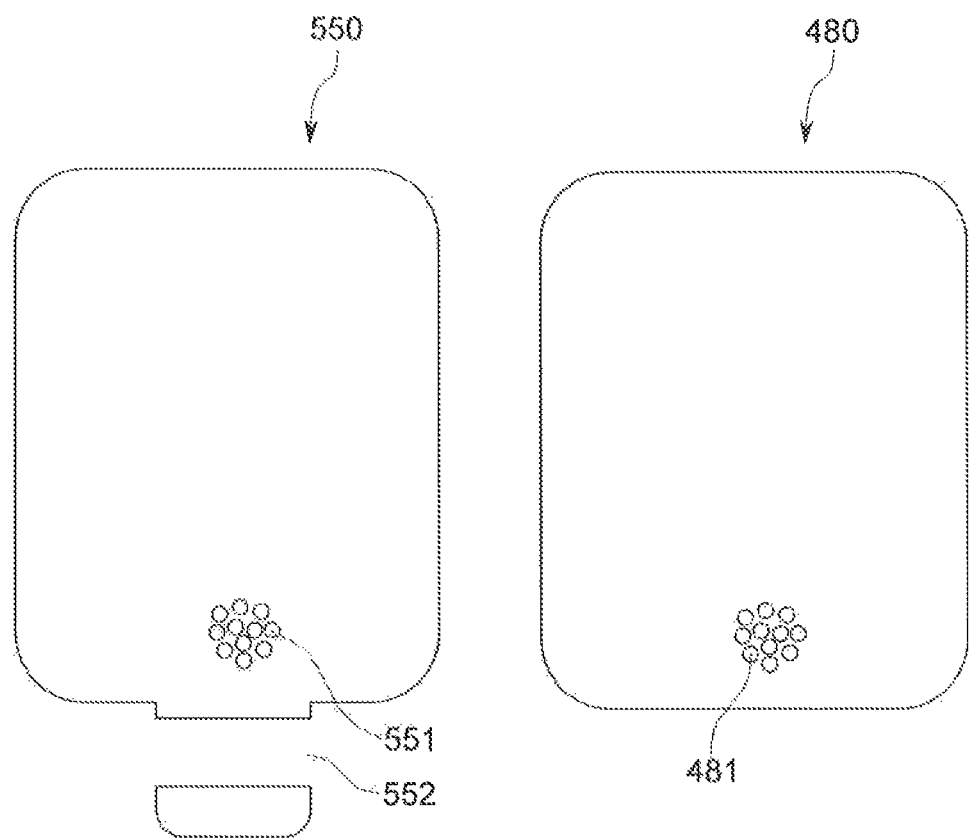
FIG. 11 is a plan view illustrating a patterned film and a heat dissipating layer of a display device according to an exemplary embodiment of the present invention.

FIG. 10 is a cross-sectional view illustrating a display device according to an exemplary embodiment of the present invention;

FIG. 11 is a plan view illustrating a patterned film and a heat dissipating layer of a display device according to an exemplary embodiment of the present invention.

Elements in FIG. 10 are stacked in a structure substantially the same as a structure of FIG. 3, and a description of the same elements as those in FIG. 3 may be omitted to avoid redundancy.

Referring to FIG. 10 and FIG. 11, each of a patterned film 550 and a heat dissipating layer 480 has an opening portion including a plurality of concentric circular holes 481 and 551, respectively. A gap 552 is provided in the patterned film 550 at a bending portion 112 of a display panel 100. For example, a part of the patterned film 550 may not be disposed at the bending portion 112 of a display panel 100.

The plurality of concentric circular holes 481 and 551 forming the respective opening portions of the patterned film 550 and the heat dissipating layer 480 may be arranged to form a substantially same shape. For example, the plurality of concentric circular holes 481 and 551 forming the respective opening portions of the patterned film 550 and the heat dissipating layer 480 may be arranged to form a circular shape. Each of the patterned film 550 and the heat dissipating layer 480 may have a plurality of opening portions each including a plurality of concentric circular holes 481 and 551.

In an exemplary embodiment of the present invention, the opening portion of the patterned film 550 may be substantially the same size as that of the opening portion of the heat dissipating layer 480.

The pluralities of holes 481 and 551 of the patterned film 550 and the heat dissipating layer 480 are located above an optical fingerprint sensor 200 to allow the light emitted from the display panel 100 and reflected by a user's finger 40 to pass therethrough. The light that has passed through the plurality of holes 481 and 551 of the patterned film 550 and the heat dissipating layer 480 reaches the optical fingerprint sensor 200.

Since the heat dissipating layer 480 having the plurality of holes 481 and 551 reduces the area of the opening portion in comparison to a case where the opening portion of the heat dissipating layer 480 is a single opening, the heat dissipation of the display panel 100 may be increased.

In addition, the plurality of holes 551 of the patterned film 550 that have a substantially same shape and are arranged in a substantially same manner as those of the plurality of holes 481 of the heat dissipating layer 480 are located above the heat dissipating layer. In addition, the plurality of holes 551 of the patterned film 550 allow light that has been emitted from the display panel 100 and reflected from the user's finger 40 to pass therethrough.

Portions other than the opening portions of the patterned film 550 and the heat dissipating layer 480 may be coated with a light non-transmitting material so that light does not pass therethrough.

Since the light reflected from the user's finger 40 passes through the plurality of holes 481 and 551 of the opening portions in the patterned film 550 and the heat dissipating layer 480 and reaches the optical fingerprint sensor 200, the straightness of the light may be increased and the blurring of the fingerprint image recognized by the optical fingerprint sensor 200 may be reduced.

Figure 12:
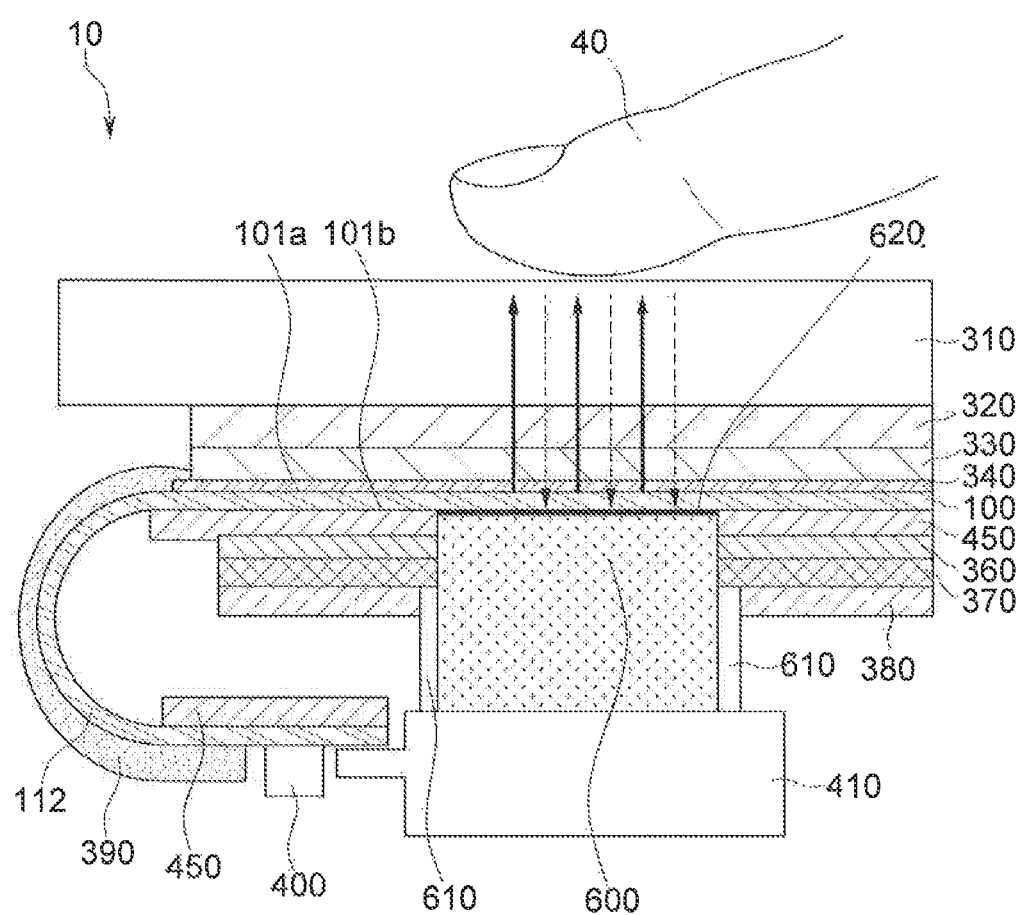
FIG. 12 is a cross-sectional view illustrating a display device according to an exemplary embodiment of the present invention.

FIG. 12 is a cross-sectional view illustrating a display device according to an exemplary embodiment of the present invention.

A patterned film 450, an embossing layer 360, a cushion layer 370, and a heat dissipating layer 380 each have opening portions, and are stacked in the same manner as in FIG. 3.

An optical fingerprint sensor 600 of a display device according to exemplary embodiment of the present invention is disposed in between the opening portions of the patterned film 450, the embossing layer 360, the cushion layer 370, and the heat dissipating layer 380, and below a display panel 100.

The optical fingerprint sensor 600 may have a height substantially the same as or more than about 0.46 cm. An adhesive layer (620) may be disposed between the display panel 100 and the optical fingerprint sensor 600. In addition, an adhesive layer 610 may be disposed between a first side surface of the optical fingerprint sensor 600 and the heat dissipating layer 380, and between a second side surface, opposite the first side surface, of the optical fingerprint sensor 600 and the heat dissipating layer 380. In an exemplary embodiment of the present invention, an adhesive layer 610 may be disposed between a first side surface of the optical fingerprint sensor 600 and the heat dissipating layer 380, the cushion layer 370 anchor the embossing layer 360, and between a second side surface, opposite the first side surface, of the optical fingerprint sensor 600 and the heat dissipating layer 380, the cushion layer 370 and/or the embossing layer 360.

Although not shown in the drawings, the optical fingerprint sensor 600 of the display device according to an exemplary embodiment of the present invention may be disposed in between the opening portions of the embossing layer 360, the cushion layer 370, and the heat dissipating layer 380, and below the patterned film 450.

Since the optical fingerprint sensor 600 of the display device 10 is disposed in between the opening portions of the patterned film 450, the embossing layer 360, the cushion layer 370, and the heat dissipating layer 380, the thickness of the display device 10 may be reduced, and the rate of fingerprint recognition of the optical fingerprint sensor 600 may be increased.

As set forth hereinabove, the display device according to an exemplary embodiment of the present invention may increase the transmittance of light reaching the optical fingerprint sensor of the OILED display device and may dissipate the heat of the display panel.

The display device according to an exemplary embodiment of the present invention may increase the straightness of light reaching the optical fingerprint sensor of the OILED display device, thereby alleviating the blurring.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
an optical fingerprint sensor;
a display panel;
a patterned film disposed below the display panel;
a heat dissipating layer disposed between the patterned film and the optical fingerprint sensor, and configured to dissipate heat; and
a cushion layer disposed between the patterned film and the heat dissipating layer, configured to absorb an impact, and comprising a first hole at a position corresponding to the optical fingerprint sensor,
wherein the patterned film and the heat dissipating layer comprise identical opening portions each having a plurality of holes at a position corresponding to the optical fingerprint sensor,
wherein the display panel contacts an air gap formed by at least one of the plurality of holes of the opening portion of the patterned film, at least one of the plurality of holes of the opening portion of the heat dissipating layer, and the first hole of the cushion layer that communicate with one another, and
a width of the first hole of the cushion layer is larger than a width of each of the plurality of holes of the opening portion of the patterned film and larger than a width of each of the plurality of holes of the opening portion of the heat dissipating layer, in a plan view.

2. The display device of claim 1, wherein each of the holes has either a circular shape, a quadrate shape, a rectangular shape, a triangular shape, or a rhombic shape.

3. The display device of claim 1, further comprising an embossing layer disposed between the patterned film and the cushion layer.

4. The display device of claim 3, wherein the embossing layer comprises a second hole, and the second hole that is substantially the same size as the first hole of the embossing layer,
wherein the second hole of the embossing layer and the first hole of the cushion layer form the air gap.

5. The display device of claim 4, wherein the opening portion of the patterned film, the opening portion of the heat dissipating layer, and the air gap are located above the optical fingerprint sensor.

6. The display device of claim 4, wherein the display panel is exposed through the air gap formed by at least one of the plurality of holes of the opening portion of the patterned film, at least one of the plurality of holes of the opening portion of the heat dissipating layer, the first hole of the cushion layer, and the second hole of the embossing layer that communicate with one another.

7. The display device of claim 6, wherein the optical fingerprint sensor is exposed through the air gap.

8. The display device of claim 1, wherein the optical fingerprint sensor is exposed through the air gap.

* * * * *